(12) United States Patent
Huang et al.

(10) Patent No.: US 7,886,254 B2
(45) Date of Patent: Feb. 8, 2011

(54) METHOD FOR AMENDING LAYOUT PATTERNS

(75) Inventors: Chia-Wei Huang, Kao-Hsiung (TW); Te-Hung Wu, Tainan County (TW); Pei-Ru Tsai, Tainan County (TW); Ping-I Hsieh, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 274 days.

(21) Appl. No.: 12/127,801

(22) Filed: May 27, 2008

(65) Prior Publication Data
US 2009/0300576 A1 Dec. 3, 2009

(51) Int. Cl.
*G06F 17/50* (2006.01)
(52) U.S. Cl. .................................................. 716/50
(58) Field of Classification Search .................. 716/1, 716/21, 50
See application file for complete search history.

(56) References Cited

U.S. PATENT DOCUMENTS

| | | | |
|---|---|---|---|
| 6,553,559 B2 | 4/2003 | Liebmann | |
| 6,901,569 B2 * | 5/2005 | Aoki | 716/5 |
| 7,571,417 B2 * | 8/2009 | Izuha et al. | 716/19 |
| 2004/0006758 A1 * | 1/2004 | Aoki | 716/19 |
| 2005/0134866 A1 * | 6/2005 | Kyoh et al. | 356/616 |
| 2005/0153217 A1 * | 7/2005 | Izuha et al. | 430/5 |
| 2007/0105243 A1 * | 5/2007 | Nagatomo et al. | 438/14 |
| 2008/0153301 A1 * | 6/2008 | Tanaka et al. | 438/703 |
| 2009/0265680 A1 * | 10/2009 | Izuha et al. | 716/21 |

* cited by examiner

*Primary Examiner*—Jack Chiang
*Assistant Examiner*—Suchin Parihar
(74) *Attorney, Agent, or Firm*—Winston Hsu; Scott Margo

(57) ABSTRACT

A method for amending layout patterns is disclosed. First, a layout pattern after an optical proximity correction is provided, which is called an amended pattern. Later, a positive sizing procedure and a negative sizing procedure are respectively performed on the amended pattern to respectively obtain a positive sizing pattern and a negative sizing pattern. Then, the positive sizing pattern and the negative sizing pattern are respectively verified to know whether they are useable. Afterwards, the useable positive sizing pattern and the negative sizing pattern are output for the manufacture of a reticle when they are verified to be useable.

28 Claims, 5 Drawing Sheets

METHOD FOR AMENDING LAYOUT PATTERNS

BACKGROUND OF THE INVENTION

1. Field of the Invention

The present invention relates to a semiconductor process. More particularly, the present invention relates to a method for correcting a layout pattern to meet the specification of the fabrication of reticles.

2. Description of the Prior Art

Photolithography and etching technologies are frequently used in semiconductor manufacturing. The photolithography technology usually involves transferring a complicated integrated circuit pattern to a semiconductor wafer surface for steps such as etching and implantation. These patterns must be extremely accurate for forming delicate integrated circuits so as to align with the patterns of the previous and following steps. In the photolithographic step, deviations occur and jeopardize the performance of the semiconductor device when the patterns on the reticles are transferred onto the wafer surface. Such deviations are usually related with the characters of the patterns to be transferred, the topology of the wafer and various process parameters.

There are many known verifications, corrections and compensations for the deviations caused by the optical proximity effect, process rules (PRC) and lithography rules (LRC) to improve the image quality after transfer. Some of the known methods are called optical proximity correction (OPC), process rule check (PRC) and lithography rule check (LRC). The commercial available OPC software may test problems such as pinch, bridge, and critical dimension uniformity in the layout patterns. Such methods not only test problems in the layout patterns but also correct the layout patterns on the reticles using the theoretical image. If the corrected image patterns are useable, they are output for the fabrication of reticles to obtain the correct image patterns on the wafer.

However, the above-mentioned verifications, corrections and compensations only take the problems of the layout pattern itself into consideration rather than the critical dimension error up to several nm during the fabrication of reticles. In other words, the above operations are based on the assumption that the corrected image patterns would be perfectly transferred during the fabrication of reticles. As a matter of fact, it is currently impossible. In particular, the corrected image patterns frequently barely pass the above operations, and almost no process window is left to the fabrication of reticles. Accordingly, problems still occur on the layout patterns formed by the photolithography and etching steps through the reticles. FIG. 9 illustrates the patterns formed by the transfer of the layout patterns after the optical proximity correction. In FIG. 9, a pair of separate and similar main features 910/920 is respectively illustrated. However, because the main features 910/920 each include the deviations originated from the fabrication of reticles, the main feature 920 includes a defect of bridge although the main features 910/920 are similar.

Last but not least, currently there is no available model for the verifications, corrections and compensations of the errors occurred during the fabrication of reticles.

The quality of the layout pattern is embodied by the film pattern after photolithography and etching. However, simulation of the patterns after fabrication to verify the layout pattern of the reticles has never been brought forward. Currently, the defects of the layout pattern on the reticles are corrected manually one by one, which is inconvenient and not user-friendly.

Hence, there is still a need of a better method for correcting a layout pattern to meet the specification of the fabrication of reticles, and further a method for constructing an optical proximity correction model. Such model may applied in the optical proximity correction and a layout pattern which is qualified for fabricating a reticle can be obtained to ensure a more precise transfer of layout patterns.

SUMMARY OF THE INVENTION

The present invention in one aspect relates to a method for correcting a layout pattern to meet the specification of the fabrication of reticles. The present invention in another aspect relates to a method for constructing an optical proximity correction model. Such optical proximity correction model may applied in the optical proximity correction and a layout pattern which is qualified for fabricating a reticle can be obtained directly to ensure a more precise transfer of layout patterns.

The present invention in one aspect provides a method for correcting a layout pattern. First, a layout pattern including at least one main feature is provided. Later, at least one optical proximity correction is performed on the layout pattern to obtain a qualified first amended pattern. After that, a positive sizing procedure is performed on the first amended pattern to obtain a positive sizing pattern. Next, the positive sizing pattern is verified as to whether it is qualified or not. Then, a negative sizing procedure is performed on the first amended pattern to obtain a negative sizing pattern. Thereafter, the negative sizing pattern is verified as to whether it is qualified or not. Subsequently, the first amended pattern which is qualified for both the positive sizing procedure and the negative sizing procedure is output to fabricating a reticle when the positive sizing pattern and the negative sizing pattern are both qualified.

The present invention on another aspect provides a method for constructing an optical proximity correction model. First, a layout pattern including at least one main feature is provided. Thereafter, at least one optical proximity correction is performed on the layout pattern to obtain a qualified first amended pattern. Later, a positive sizing procedure is performed on the first amended pattern to obtain a positive sizing pattern and positive sizing data. After that, the positive sizing pattern is verified as to whether it is qualified or not. Next, a negative sizing procedure is performed on the first amended pattern to obtain a negative sizing pattern and negative sizing data. Subsequently, the negative sizing pattern is verified as to whether it is qualified or not. Then, the positive sizing data and the negative sizing data are collected to construct the optical proximity correction model when the positive sizing pattern and the negative sizing pattern are both qualified.

These and other objectives of the present invention will no doubt become obvious to those of ordinary skill in the art after reading the following detailed description of the preferred embodiment that is illustrated in the various figures and drawings.

DETAILED DESCRIPTION

The present invention in one aspect provides a method for calibrating the errors occurred in the fabrication of the reticles to increase the process window of the fabrication of the reticles. The present invention in another aspect provides a method for constructing an optical proximity correction model. Such optical proximity correction model may be applied in the optical proximity correction, and a layout pattern which is qualified for fabricating a reticle can be obtained directly to ensure a more precise transfer of layout patterns.

Figure 1:
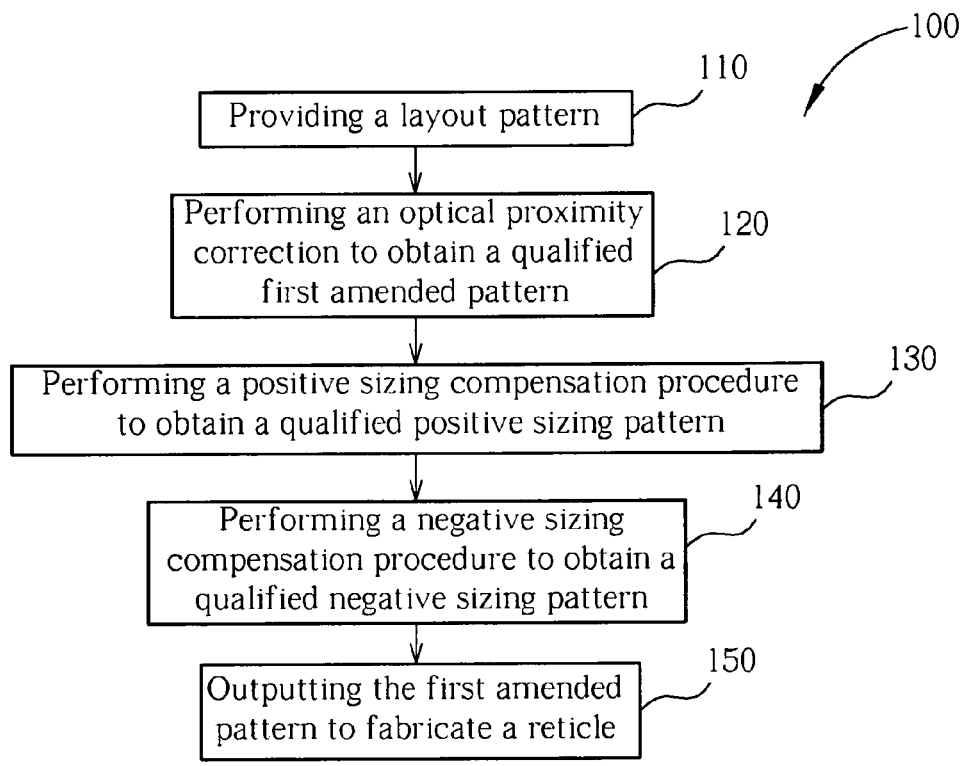
FIG. 1 illustrates the flow chart of the main flow of the method for correcting a layout pattern of the present invention.

FIG. 1 illustrates the flow chart of the main flow of the method for correcting a layout pattern of the present invention. The method 100 for correcting a layout pattern of the present invention includes the following steps:

110: providing a layout pattern;

120: performing at least one optical proximity correction on the layout pattern to obtain a qualified first amended pattern;

130: performing a positive sizing compensation procedure on the first amended pattern to obtain a qualified positive sizing pattern;

140: performing a negative sizing compensation procedure with respect to the qualified positive sizing pattern to obtain a qualified negative sizing pattern;

150: outputting the first amended pattern which is qualified for all the optical proximity correction, the positive sizing procedure and the negative sizing procedure to fabricate a reticle.

First, in step 110 the layout pattern may be a pattern that needs transferring, for example, a layout pattern such as doped regions, poly-silicon or contact holes of static random access memory. In the layout pattern, the geometric shapes are called main features. In other words, the layout pattern in step 110 may include at least one main feature.

Figure 2:
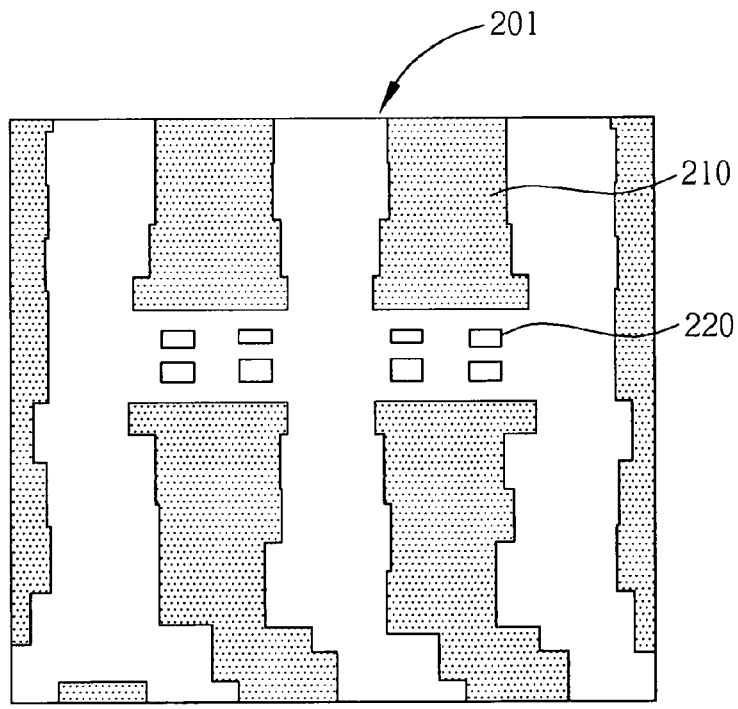
FIG. 2 illustrates the method for correcting a layout pattern of the present invention.

Secondly, in step 120 the original layout pattern undergoes at least one optical proximity correction to obtain a first amended pattern which is deemed qualified with respect to the optical proximity correction rule. FIG. 2 illustrates the method for correcting a layout pattern of the present invention. The main feature in the original layout pattern after the optical proximity correction becomes the first amended main feature 210 in the first amended pattern 201. In addition, at least one first amended auxiliary feature is generated. The defects which may be caused by the distortion of the optical proximity effect in the original layout pattern, i.e. the main feature, are corrected to be the first amended main feature 210 in the first amended pattern 201, and further the first amended auxiliary features 220 are introduced by using the optical proximity correction. Such optical proximity correction may be carried out by the optical proximity correction software which are commercially available to test problems of the main features such as pinch, bridge, and critical dimension uniformity in the layout patterns. The details are not described here.

Figure 3:
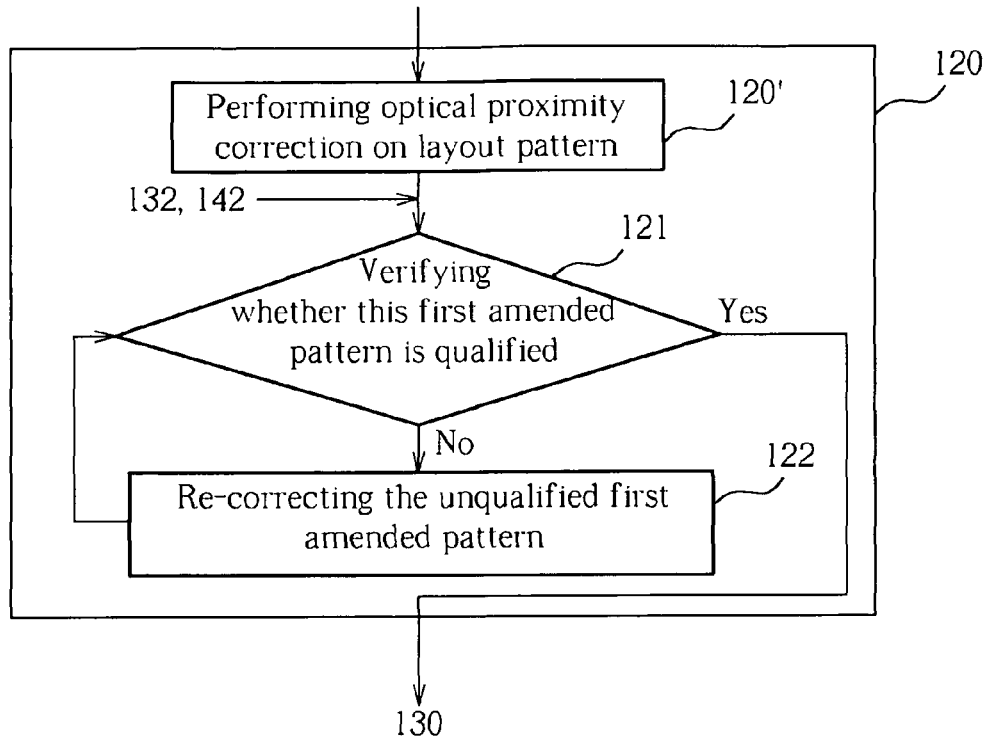
FIG. 3 illustrates the sub-steps derived form the step 120 of the method for correcting a layout pattern of the present invention.

Please note that in step 120, the operation on the original layout pattern may be more than one time. Because there might be still some main features that have not passed the PRC and the LRC yet after each optical proximity correction, the step 120 may further include the following sub-steps. FIG. 3 illustrates the sub-steps derived form the step 120 of the method for correcting a layout pattern of the present invention. For example, after sub-step 120' "performing optical proximity correction on layout pattern", may be:

Sub-step 121: verifying whether this first amended pattern after the optical proximity correction is qualified using a PRC and a LRC respectively.

If the first amended pattern is qualified then this step is followed by step 130. If the first amended pattern is not qualified, then the process goes to:

Sub-step 122: re-correcting the unqualified first amended pattern.

Optionally, sub-step 121 and sub-step 122 may be repeated as many times as needed till the qualified first amended pattern is obtained. This way, the optical proximity correction may be carried out many times so that all of the first amended main features 210 in the first amended pattern 201 pass the PRC and the LRC, which are called the qualified first amended pattern. During the sub-step 120' and the sub-step 122, the extent of correction of the first amended pattern is depending on the unqualified first amended pattern main features 210. The first amended pattern may be corrected manually, or automatically by commercially available software.

In step 130, the qualified first amended pattern now undergoes a positive sizing compensation procedure in order to obtain a qualified positive sizing pattern. Such positive sizing compensation procedure may in general include performing a positive sizing procedure on the first amended pattern to obtain a positive sizing pattern, then verifying whether the positive sizing pattern is qualified or not. Hence, the positive sizing compensation procedure may therefore include some sub-steps.

The so-called "positive sizing compensation procedure" may be performing a sizing up procedure on the qualified first amended pattern to obtain a positive sizing pattern. Such positive sizing pattern may be useful in testing the expansion-style error during the fabrication of the reticles. The fashion to size up the qualified first amended pattern may be, for example, sizing up the first amended main feature, the first amended auxiliary feature, or both. The extent of sizing up depends on the errors/deviations during the fabrication of the reticles, and even further the difference of following steps such as etching to have discriminatory adjustments on different reticles for different thin films may be taken into consideration. For example, the extent for the reticles of poly-Si may be 4-8 nm and the extent for the reticles of metal layer may be 6-10 nm. Further, the first amended main feature and the first amended auxiliary feature each may independently have sizing up factors. Optionally, the first amended main feature and the first amended auxiliary feature may have different sizing up factors.

Figure 4:
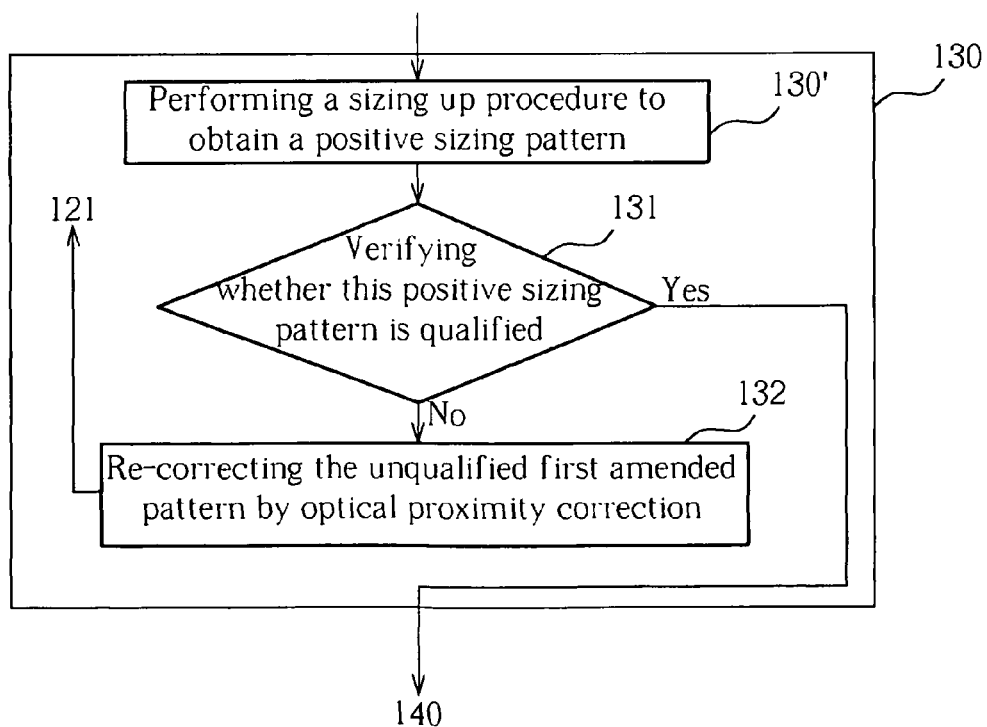
FIG. 4 illustrates the sub-steps derived form the step 130 of the method for correcting a layout pattern of the present invention.

Similarly, in step 130 the operation of the positive sizing compensation procedure on the qualified first amended pattern may be more than one time. Because there might be still some first amended main features and/or some first amended auxiliary features that have not passed the PRC and the LRC yet after each sizing up procedure, the step 130 may further include the following sub-steps. FIG. 4 illustrates the sub-steps derived form the step 130 of the method for correcting a layout pattern of the present invention. For example, after sub-step 130' "performing a sizing up procedure on the qualified first amended pattern to obtain a positive sizing pattern", may be:

Sub-step 131: verifying whether this positive sizing pattern is qualified using a PRC and a LRC respectively.

If the positive sizing pattern is qualified then this step is followed by step 140. If the positive sizing pattern is not qualified, then the process goes to:

Sub-step 132: re-correcting the unqualified first amended pattern by optical proximity correction.

Optionally, sub-step 131 and sub-step 132 may be repeated as many times as needed till the qualified positive sizing pattern that passes the PRC and the LRC is obtained. This way, the optical proximity correction may be carried out many times so that all of the first amended main features and all of the first amended auxiliary features in the positive sizing pattern pass the PRC and the LRC, which are called the qualified positive sizing pattern. During the sub-step 130' and the sub-step 132, the extent of correction of the positive sizing pattern depends on the unqualified positive sizing pattern. The positive sizing pattern may be corrected manually, or automatically.

In step 140, the qualified positive sizing pattern now undergoes a negative sizing compensation procedure in order to obtain a qualified negative sizing pattern. Such negative sizing compensation procedure may in general include performing a negative sizing procedure on the first amended pattern to obtain a negative sizing pattern, then verifying whether the negative sizing pattern is qualified or not. Hence, the negative sizing compensation procedure may therefore include some sub-steps.

The so-called "negative sizing compensation procedure" may be performing a sizing down procedure on the qualified first amended pattern to obtain a negative sizing pattern. Such negative sizing pattern may be useful in testing the shrinkage-style error during the fabrication of the reticles. The fashion to size down the qualified first amended pattern may be, for example, sizing down the first amended main feature, the first amended auxiliary feature, or both obtained in step 130. The extent of sizing down depends on the errors/deviations during the fabrication of the reticles, and even further the difference of following steps such as etching to have discriminatory adjustments on different reticles for different thin films may be taken into consideration. For example, the extent for the reticles of poly-Si may be 4-8 nm and the extent for the reticles of metal layer may be 6-10 nm. Further, the first amended main feature and the first amended auxiliary feature each may independently have sizing down factors. Optionally, the first amended main feature and the first amended auxiliary feature may have different sizing down factors.

Figure 5:
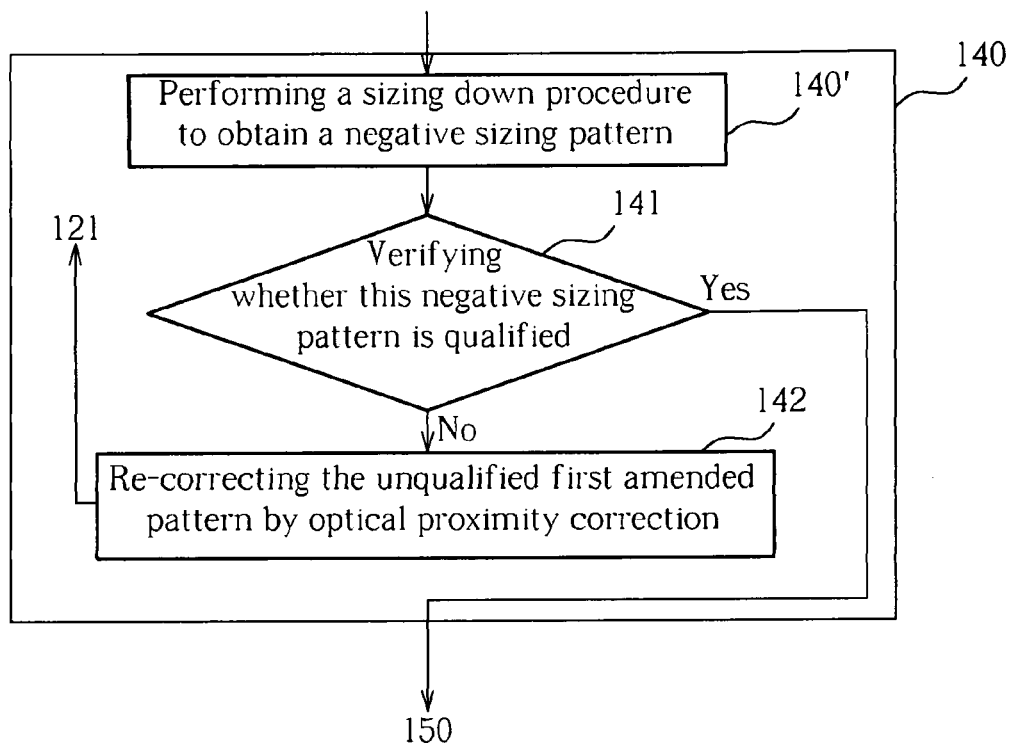
FIG. 5 illustrates the sub-steps derived form the step 140 of the method for correcting a layout pattern of the present invention.

In step 140 the operation of the negative sizing compensation procedure on the qualified positive sizing pattern may be more than one time. Because there might be still some first amended main features and/or some first amended auxiliary features that have not passed the PRC and the LRC yet after each sizing down procedure, the step 140 may further include the following sub-steps. FIG. 5 illustrates the sub-steps derived form the step 140 of the method for correcting a layout pattern of the present invention. For example, after sub-step 140' "performing a sizing down procedure on the qualified first amended pattern to obtain a negative sizing pattern", may be:

Sub-step 141: verifying whether this negative sizing pattern is qualified using a PRC and a LRC respectively.

If the negative sizing pattern is qualified then this step is followed by step 150. If the negative sizing pattern is not qualified, then the process goes to:

Sub-step 142: re-correcting the unqualified first amended pattern by optical proximity correction.

Optionally, sub-step 141 and sub-step 142 may be repeated as many times as needed till the qualified negative sizing pattern that passes the PRC and the LRC is obtained. This way, the optical proximity correction may be carried out many times so that all of the first amended main features and all of the first amended auxiliary features in the negative sizing pattern pass the PRC and the LRC, which are called the qualified negative sizing pattern. During the sub-step 140' and the sub-step 142, the extent of correction of the negative sizing pattern depends on the unqualified negative sizing pattern. The negative sizing pattern may be corrected manually, or automatically.

Please note that step 130 and step 140 are not required to be performed in any specific order. In other words, step 130 may be performed before step 140, or step 140 may be performed before step 130.

Since the qualified negative sizing pattern is derived from the qualified positive sizing pattern, and the qualified positive sizing pattern is derived from the first amended pattern, the qualified negative sizing pattern is qualified with respect to "step 120: performing optical proximity correction on the layout pattern," "sub-step 131: verifying whether this positive sizing pattern is qualified using a PRC and a LRC respectively" of step 130 and "sub-step 141: verifying whether this negative sizing pattern is qualified using a PRC and a LRC respectively" of step 140. Now the original layout pattern becomes a qualified layout pattern, i.e. a qualified negative sizing pattern, a qualified positive sizing pattern as well as a qualified first amended pattern, that is, qualified with respect to the optical proximity correction, the positive sizing compensation procedure and the negative sizing compensation procedure. Then, the first amended pattern which is qualified for all the optical proximity correction, the positive sizing procedure and the negative sizing procedure may be output to fabricating a reticle. The image pattern resulted from the reticle can be correctly formed on a wafer.

In the sub-steps (130'/140' and 132/142) of step 130 and step 140, the extent of correction of the positive sizing pattern and the negative sizing pattern respectively depends on the unqualified positive sizing pattern and the unqualified negative sizing pattern, respectively. In order to solve the problem that respectively the unqualified positive sizing pattern and the unqualified negative sizing pattern are repeatedly corrected manually, the present invention on the other hand provides a method for constructing an optical proximity correction model.

The method for constructing an optical proximity correction model of the present invention obtains a positive sizing data when the positive sizing procedure is performed on the first amended pattern and obtains a negative sizing data when the negative sizing procedure is performed on the first amended pattern. Both positive sizing data and negative sizing data are collected to construct the required optical proximity correction model when the negative sizing pattern and the positive sizing pattern are all qualified.

Figure 6:
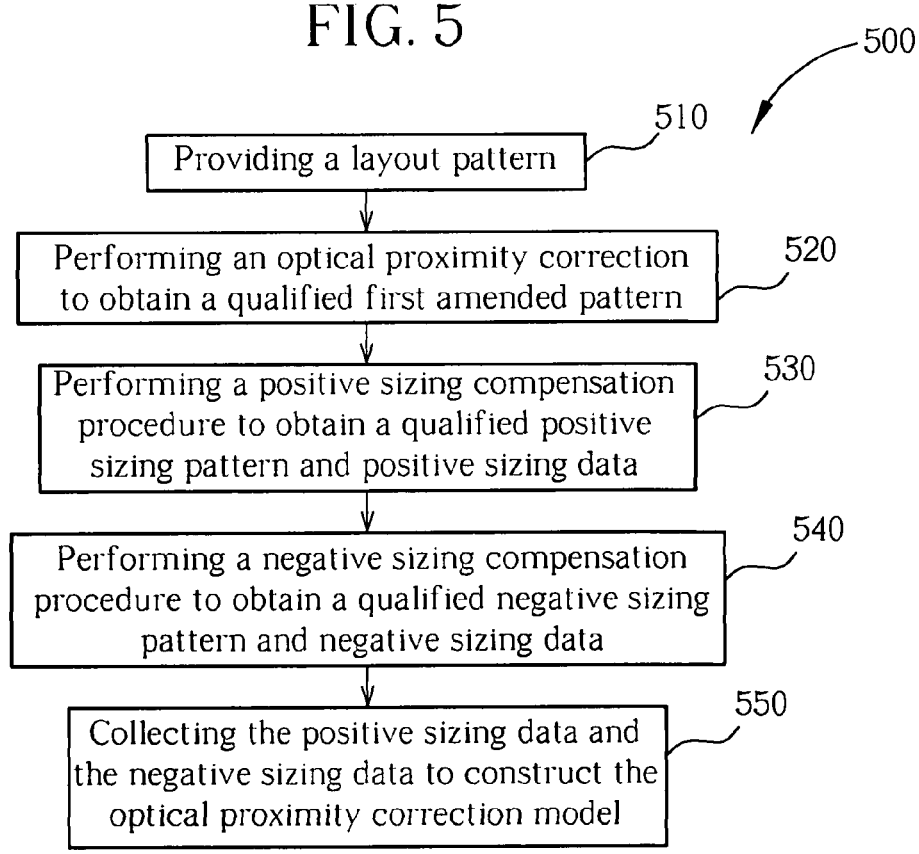
FIG. 6 illustrates the flow chart of the main flow of the method for constructing an optical proximity correction model of the present invention.

FIG. 6 illustrates the flow chart of the main flow of the method for constructing an optical proximity correction model of the present invention. The method 500 for constructing an optical proximity correction model of the present invention includes the following steps:

510: providing a layout pattern;

520: performing at least one optical proximity correction on the layout pattern to obtain a qualified first amended pattern;

530: performing a positive sizing compensation procedure on the first amended pattern to obtain a qualified positive sizing pattern and positive sizing data;

540: performing a negative sizing compensation procedure with respect to the qualified positive sizing pattern to obtain a qualified negative sizing pattern and negative sizing data;

550: collecting the positive sizing data and the negative sizing data to construct the optical proximity correction model when the positive sizing pattern and the negative sizing pattern are both qualified.

First, in step 510 the layout pattern may be a pattern that needs transferring, for example, a layout pattern such as the static random access memory. In the layout pattern, the geometric shapes are called main features. In other words, the layout pattern in step 510 may include at least one main feature.

Secondly, in step 520 the original layout pattern undergoes at least one optical proximity correction to obtain a first amended pattern which is deemed qualified with respect to the optical proximity correction rule. The operations of step 520 are similar to those of step 120 and the details are not described here. Step 520 may also further include sub-steps which are similar to those of step 120. For example, sub-step 521 may refer to sub-step 121, and sub-step 522 may refer to sub-step 122.

Figure 7:
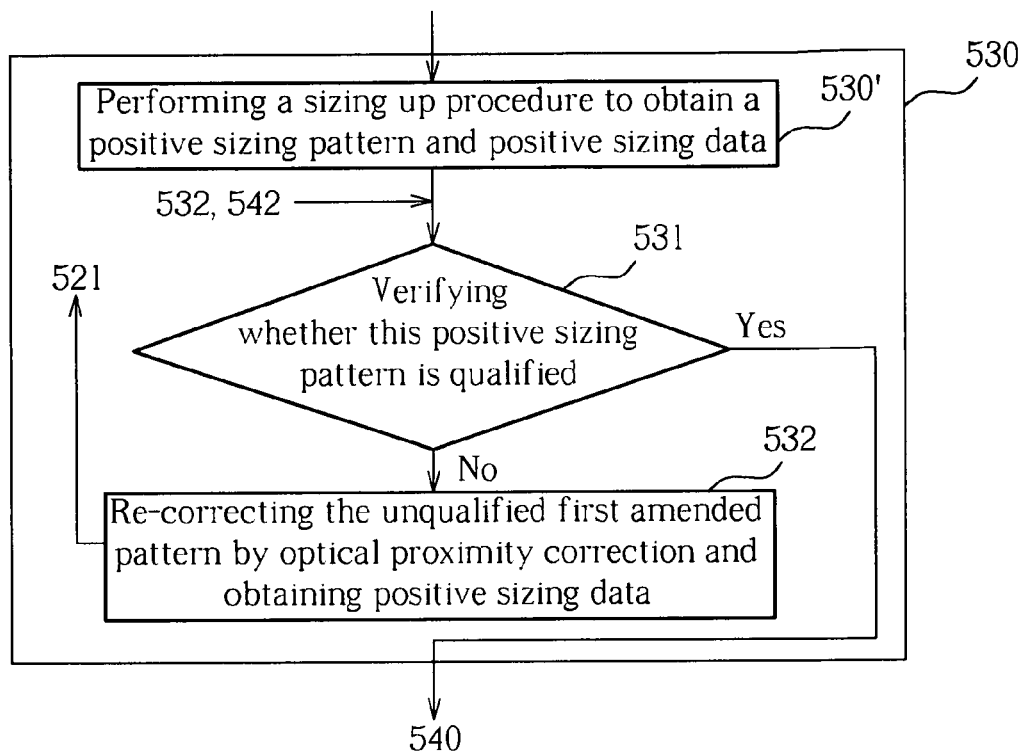
FIG. 7 illustrates the sub-steps derived form the step 530 of the method for constructing an optical proximity correction model of the present invention.

In step 530, the qualified first amended pattern now undergoes a positive sizing compensation procedure in order to obtain a qualified positive sizing pattern. Such positive sizing compensation procedure may in general be similar to those of step 130. Hence, step 530 may therefore include some sub-steps similar to those of step 130. FIG. 7 illustrates the sub-steps derived form the step 530 of the method for constructing an optical proximity correction model of the present invention. For example, after sub-step 530' "performing a sizing up procedure on the qualified first amended pattern to obtain a positive sizing pattern and positive sizing data", may be:

Sub-step 531: verifying whether this positive sizing pattern is qualified using a PRC and a LRC respectively.

If the positive sizing pattern is qualified then this step is followed by step 540. If the positive sizing pattern is not qualified, then the process goes to:

Sub-step 532: re-correcting the unqualified first amended pattern by optical proximity correction and obtaining positive sizing data.

Because sub-steps may be repeated as many times as needed till the qualified positive sizing pattern that passes the PRC and the LRC is obtained, corresponding sizing data can be obtained, which is called "positive sizing data." The more the corrections, the more abundant the positive sizing data are. Eventually, when the qualified positive sizing pattern that passes the PRC and the LRC is obtained, the positive sizing data may serve as the quick guide for obtaining the qualified positive sizing pattern.

Because the optical proximity correction may be carried out many times so that all of the first amended main features and all of the first amended auxiliary features in the positive sizing pattern finally pass the PRC and the LRC, the qualified positive sizing pattern can only be obtained by probably repeatedly correcting the first amended pattern manually in the absence of the assistance of the positive sizing data. With the help of the positive sizing data, the positive sizing pattern may be obtained automatically so as to shorten the operational period dramatically.

Figure 8:
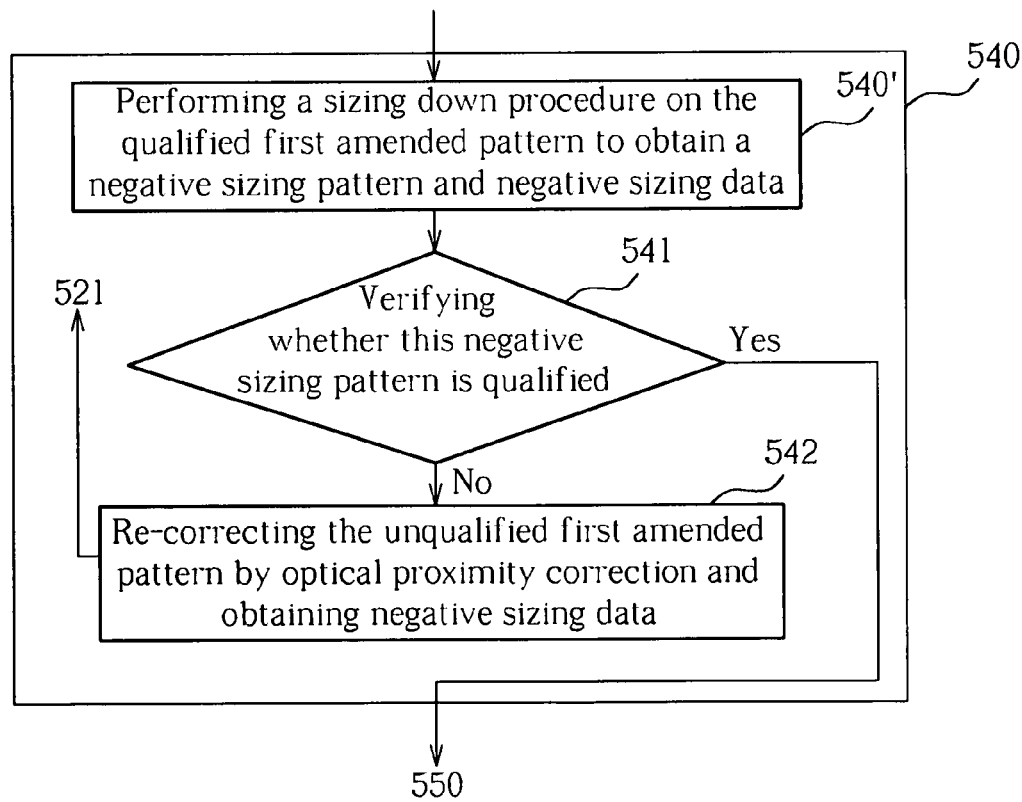
FIG. 8 illustrates the sub-steps derived form the step 540 of the method for constructing an optical proximity correction model of the present invention.
Figure 9:
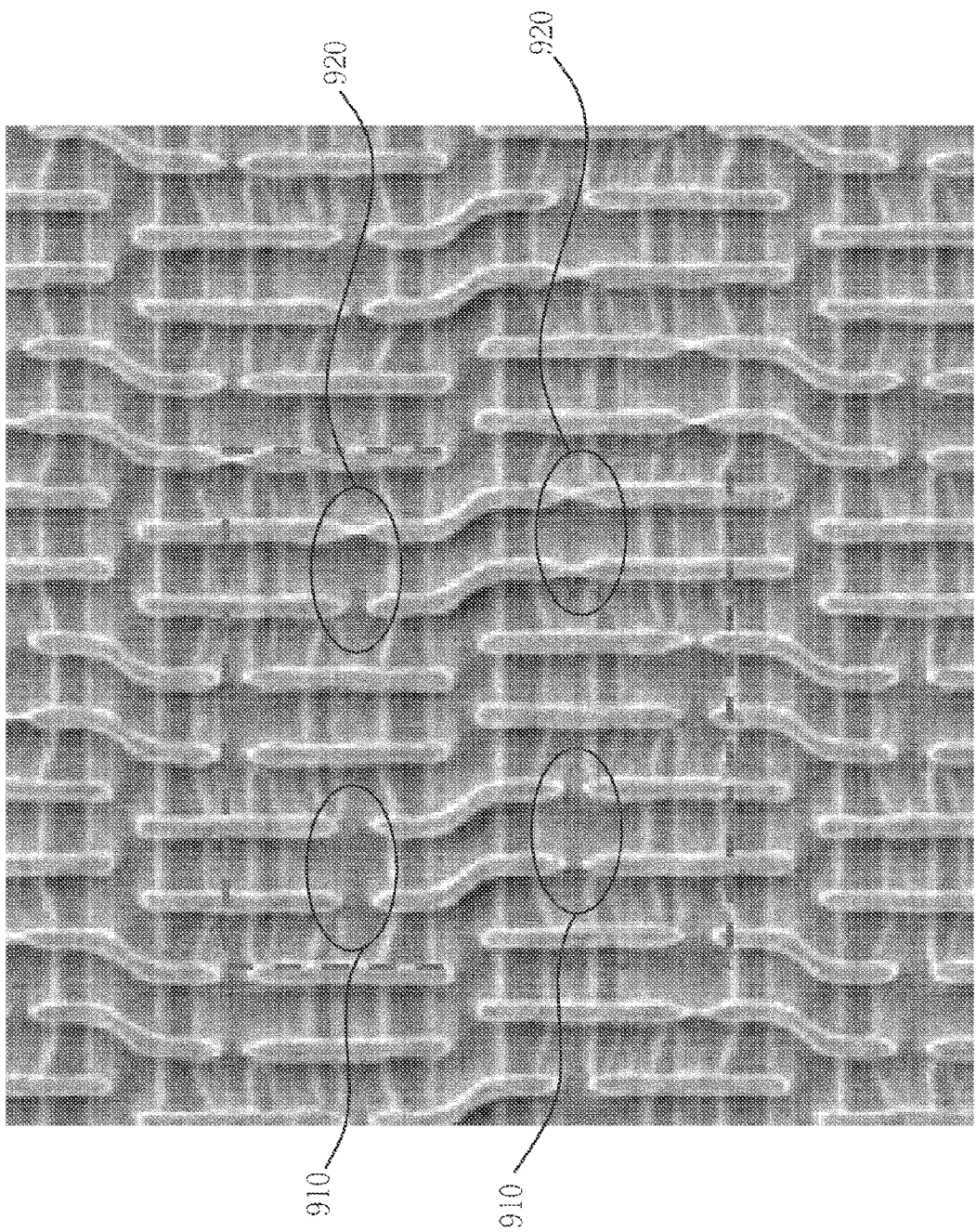
FIG. 9 illustrates the patterns formed by the transfer of the layout patterns after the optical proximity correction.

In step 540, the qualified positive sizing pattern now undergoes a negative sizing compensation procedure in order to obtain a qualified negative sizing pattern. Such negative sizing compensation procedure may in general be similar to those of step 140. Hence, step 540 may therefore include some sub-steps similar to those of step 140. FIG. 8 illustrates the sub-steps derived form the step 540 of the method for constructing an optical proximity correction model of the present invention. For example, after sub-step 540' "performing a sizing down procedure on the qualified first amended pattern to obtain a negative sizing pattern and negative sizing data", may be:

Sub-step 541: verifying whether this negative sizing pattern is qualified using a PRC and a LRC respectively.

If the negative sizing pattern is qualified then this step is followed by step 550. If the negative sizing pattern is not qualified, then the process goes to:

Sub-step 542: re-correcting the unqualified first amended pattern by optical proximity correction and obtaining negative sizing data.

Because sub-steps may be repeated as many times as needed till the qualified negative sizing pattern that passes the PRC and the LRC is obtained, corresponding sizing data can be obtained, which is called "negative sizing data." The more the corrections, the more abundant the negative sizing data are. Eventually, when the qualified negative sizing pattern that passes the PRC and the LRC is obtained, the negative sizing data may serve as the quick guide for obtaining the qualified negative sizing pattern.

Because the optical proximity correction may be carried out many times so that all of the first amended main features and all of the first amended auxiliary features in the negative sizing pattern finally pass the PRC and the LRC, the qualified negative sizing pattern can only be obtained by probably repeatedly correcting the first amended pattern manually in the absence of the assistance of the negative sizing data. With the help of the negative sizing data, the negative sizing pattern may be obtained automatically so as to shorten the operational period dramatically.

Please note that step 530 and step 540 are not required to be performed in any specific order. In other words, step 530 may be performed before step 540, or step 540 may be performed before step 530.

The positive sizing data and the negative sizing data are collected to construct the optical proximity correction model when the positive sizing pattern and the negative sizing pattern are both qualified.

Those skilled in the art will readily observe that numerous modifications and alterations of the device and method may be made while retaining the teachings of the invention.

What is claimed is:

1. A method for correcting a layout pattern, comprising:
providing a layout pattern comprising at least one main feature;
performing at least one optical proximity correction on said layout pattern to obtain a first amended pattern which is qualified;
performing a positive sizing procedure on said first amended pattern to obtain a positive sizing pattern;
verifying whether said positive sizing pattern is qualified;
performing a negative sizing procedure on said first amended pattern to obtain a negative sizing pattern;

verifying whether said negative sizing pattern is qualified; and outputting said first amended pattern which is qualified for both said positive sizing procedure and said negative sizing procedure to fabricating a reticle when said positive sizing pattern and said negative sizing pattern are both qualified.

2. The method of claim 1, wherein said layout pattern comprises an SRAM layout pattern.

3. The method of claim 1, wherein obtaining said first amended pattern which is qualified further comprises:
   (a) using a PRC and a LRC respectively to verify whether said first amended pattern after said optical proximity correction is qualified;
   (b) correcting said first amended pattern which is unqualified by said optical proximity correction when said first amended pattern is not qualified; and
   repeating (a) and (b) till said first amended pattern which is qualified is obtained and the extent of correction depending on said first amended pattern which is unqualified.

4. The method of claim 1, wherein said first amended pattern comprises a first amended main feature and a first amended auxiliary feature.

5. The method of claim 4, wherein performing said positive sizing procedure comprises:
   performing a sizing up procedure on said first amended pattern to obtain said positive sizing pattern.

6. The method of claim 5, wherein performing said sizing up procedure on said first amended pattern comprises sizing up at least one of said first amended main feature and said first amended auxiliary feature.

7. The method of claim 6, wherein said first amended main feature and said first amended auxiliary feature are independently sized up.

8. The method of claim 1, wherein verifying whether said positive sizing pattern is qualified or not comprises:
   using a PRC and a LRC respectively to verify whether said positive sizing pattern is qualified or not.

9. The method of claim 8, further comprising:
   correcting said first amended pattern by said optical proximity correction when said positive sizing pattern is not qualified and the extent of correction depending on said positive sizing pattern which is unqualified till said positive sizing pattern passes said PRC and said LRC.

10. The method of claim 4, wherein performing said negative sizing procedure comprises:
    performing a sizing down procedure on said first amended pattern to obtain said negative sizing pattern.

11. The method of claim 10, wherein performing said sizing down procedure on said first amended pattern comprises sizing down at least one of said first amended main feature and said first amended auxiliary feature.

12. The method of claim 11, wherein said first amended main feature and said first amended auxiliary feature are independently sized down.

13. The method of claim 1, wherein verifying whether said negative sizing pattern is qualified or not comprises:
    using a PRC and a LRC respectively to verify whether said negative sizing pattern is qualified.

14. The method of claim 13, further comprising:
    correcting said first amended pattern by said optical proximity correction when said negative sizing pattern is not qualified and the extent of correction depending on said negative sizing pattern which is unqualified till said negative sizing pattern passes said PRC and said LRC.

15. A method for constructing an optical proximity correction model for use in a reticle, comprising:
    providing a layout pattern comprising at least one main feature;
    performing at least one optical proximity correction on said layout pattern to obtain a first amended pattern which is qualified;
    performing a positive sizing procedure on said first amended pattern to obtain a positive sizing pattern and positive sizing data;
    verifying whether said positive sizing pattern is qualified;
    performing a negative sizing procedure on said first amended pattern to obtain a negative sizing pattern and negative sizing data;
    verifying whether said negative sizing pattern is qualified; and
    collecting said positive sizing data and said negative sizing data to construct said optical proximity correction model and to fabricate the reticle when said positive sizing pattern and said negative sizing pattern are both qualified.

16. The method of claim 15, wherein said layout pattern comprises an SRAM layout pattern.

17. The method of claim 15, wherein obtaining said first amended pattern which is qualified further comprises:
    (a) using a PRC and a LRC respectively to verify whether said first amended pattern after said optical proximity correction is qualified;
    (b) correcting said first amended pattern which is unqualified by said optical proximity correction when said first amended pattern is not qualified; and
    repeating (a) and (b) till said first amended pattern which is qualified is obtained and the extent of correction depending on said first amended pattern which is unqualified.

18. The method of claim 15, wherein said first amended pattern comprises a first amended main feature and a first amended auxiliary feature.

19. The method of claim 18, wherein performing said positive sizing procedure comprises:
    performing a sizing up procedure on said first amended pattern to obtain said positive sizing pattern.

20. The method of claim 19, wherein performing said sizing up procedure on said first amended pattern comprises sizing up at least one of said first amended main feature and said first amended auxiliary feature.

21. The method of claim 20, wherein said first amended main feature and said first amended auxiliary feature are independently sized up.

22. The method of claim 15, wherein verifying whether said positive sizing pattern is qualified or not comprises:
    using a PRC and a LRC respectively to verify whether said positive sizing pattern is qualified.

23. The method of claim 22, further comprising:
    correcting said first amended pattern by said optical proximity correction when said positive sizing pattern is not qualified and the extent of correction depending on said positive sizing pattern which is unqualified till said positive sizing pattern passes said PRC and said LRC.

24. The method of claim 15, wherein performing said negative sizing procedure comprises:
    performing a sizing down procedure on said first amended pattern to obtain said negative sizing pattern.

25. The method of claim 24, wherein performing said sizing down procedure on said first amended pattern comprises sizing down at least one of said first amended main feature and said first amended auxiliary feature.

26. The method of claim 25, wherein said first amended main feature and said first amended auxiliary feature are independently sized down.

27. The method of claim 15, wherein verifying whether said negative sizing pattern is qualified or not comprises:
   using a PRC and a LRC respectively to verify whether said negative sizing pattern is qualified.

28. The method of claim 27, further comprising:
   correcting said first amended pattern by said optical proximity correction when said negative sizing pattern is not qualified and the extent of correction depending on said negative sizing pattern which is unqualified till said negative sizing pattern passes said PRC and said LRC.

* * * * *